United States Patent [19]

Mizuno

[11] Patent Number: 5,670,903
[45] Date of Patent: Sep. 23, 1997

[54] CLOCK SIGNAL DISTRIBUTION CIRCUIT HAVING A SMALL CLOCK SKEW

[75] Inventor: Masayuki Mizuno, Tokyo, Japan

[73] Assignee: NEC Corporation, Tokyo, Japan

[21] Appl. No.: 521,433

[22] Filed: Aug. 30, 1995

[30] Foreign Application Priority Data

Aug. 30, 1994 [JP] Japan ................ 6-204080

[51] Int. Cl.⁶ ................ H03K 5/13; H03K 5/00
[52] U.S. Cl. ............ 327/158; 327/149; 327/156; 327/244
[58] Field of Search ................ 327/149, 155–159, 327/161, 243–245; 331/11, 12

[56] References Cited

U.S. PATENT DOCUMENTS

| | | | |
|---|---|---|---|
| 4,881,243 | 11/1989 | Whitt | 327/155 |
| 4,922,141 | 5/1990 | Lofgren et al. | 327/158 |
| 5,101,117 | 3/1992 | Johnson et al. | 327/158 |
| 5,295,164 | 3/1994 | Yamamura | 327/159 |
| 5,408,200 | 4/1995 | Buhler | 327/156 |

Primary Examiner—Timothy P. Callahan
Assistant Examiner—T. T. Lam
Attorney, Agent, or Firm—Sughrue, Mion, Zinn, Macpeak & Seas, PLLC

[57] ABSTRACT

A clock signal distribution circuit provides a synchronized clock signal to a plurality of chips implementing an integrated circuit. The clock signal distribution circuit has a first and a second phase lock loop, a series of voltage controlled delay circuits and a pair of transmission lines formed between the chips. The input clock signal is transmitted from the first chip to the second chip through a transmission line, the end of which is a node supplying the output clock signal to the internal circuit of the second chip. The clock signal is then returned from the output node through the second transmission line. The first phase lock loop controls the series of voltage controlled delay circuits such that the signal at a midpoint reference node has a phase equal to the phase of the output clock signal. The second phase lock loop controls the first voltage controlled delay circuit such that the signal at the first output node has a phase synchronized with the phase of the input clock signal. A plurality of transmission lines with differing delay lengths may be accommodated by bypassing a number of voltage controlled delay circuits, proportional to the delay length of the transmission lines, split equally before the clock output and after the return input.

18 Claims, 7 Drawing Sheets

CLOCK SIGNAL DISTRIBUTION CIRCUIT HAVING A SMALL CLOCK SKEW

BACKGROUND OF THE INVENTION (a) Field of the Invention

The present invention relates to a clock signal distribution circuit having a small clock skew.

(b) Description of the Related Art

A high-speed semiconductor integrated circuit implemented on a plurality of chips generally includes a clock signal distribution circuit for supplying a clock signal having a low clock skew to the integrated circuit.

FIG. 1 shows an example of a conventional clock signal distribution circuit described in an IEEE Journal of Solid-State Circuits, vol. 23, No. 5, October, 1988, pp. 1218–1223. The conventional clock signal distribution circuit includes a voltage controlled delay circuit 800, a first output buffer 809, a fixed delay circuit 817, a second output buffer 811 and a phase lock loop including a phase comparator 803, a charge pump circuit 804 and a low-pass filter 805.

The input of the voltage controlled delay circuit 800 is connected to an input clock signal line 815 while the output thereof is connected to a first output clock signal line 816a. The voltage controlled delay circuit 800 can control the delay time thereof based on a control signal output from the low-pass filter 805. The first output buffer 809 has an input connected to the output clock signal line 816a, and an output connected to a clock signal transmission line 813 which is disposed between chips, has a large length and provides the clock signal with a significant phase delay. The fixed delay circuit 817 has an input connected to the input clock signal line 815 and an output connected to a second output clock signal line 816b and the input of the second output buffer 811. The output of the second output buffer 811 is connected to a second clock signal transmission line 814 having a large length. The phase comparator 803 compares the phases of the clock signals transmitted from the first and second clock signal transmission lines 813 and 814, and generates output signals based on the phase difference between both the clock signals. The charge pump circuit 804 receives the outputs of the phase comparator 803, and supplies an output control signal based on the phase difference to the control input of the voltage controlled delay circuit 800 through the low-pass filter 805.

When the difference between the parasitic capacitances and resistances of the clock signal transmission lines 813 and 814 are negligibly small, the phase lock loop constituted by the phase comparator 803, the charge pump circuit 804, and the low-pass filter circuit 805 functions for controlling the voltage controlled delay circuit 800 so that the phase of the first clock signal output from the first output clock line 816a is equal to the phase of the second clock signal output from the second output clock line 816b. In detail, when the phase of the second clock signal from the line 814 leads the phase of the first clock signal from the line 813, the phase difference is detected by the phase comparator 803, based on the output of which the charge pump circuit 804 controls the voltage controlled delay circuit 800 to decrease the delay time thereof.

Similarly, when the phase of the first clock signal from the line 813 leads the phase of the second clock signal from the line 814, the charge pump circuit 804 controls the voltage controlled delay circuit 800 to increase the delay thereof. Accordingly, in a quiescent state, the phases of both output clock signals from the output clock signal lines 816a and 816b are equal to each other and there is substantially no clock skew between the output clock signal lines.

In the conventional clock signal distribution circuit shown in FIG. 1, such a case often arises in which the fixed delay circuit 817 and the second output buffer 811 are included in one semiconductor chip, while the voltage controlled delay circuit 800, the first output buffer 809, the phase comparator 803, the charge pump circuit 804 and the low-pass filter 805 are included in another semiconductor chip. In this case, it is difficult to obtain the circuit configuration in which the lengths of the clock signal transmission lines 813 and 814 are equal to each other. Hence, the phase difference between the output clock signals supplied from the output clock signal lines 816a and 816b cannot be neglected in a high-speed integrated circuit.

SUMMARY OF THE INVENTION

It is therefore an object of the present invention to provide a clock signal distribution circuit, wherein the phase difference is small and negligible between the output clock signals from a plurality of output clock signal lines or between the output clock signal and the input clock signal.

According to a first aspect of the present invention, there is provided a clock signal distribution circuit which comprises: a first voltage controlled delay circuit including an input for receiving an input clock signal; a second voltage controlled delay circuit including an input connected to the output of the first voltage controlled delay circuit; a third voltage controlled delay circuit including an input connected to the output of said second voltage controlled delay circuit, each of said first through third voltage controlled delay circuits having a control input and generating an output signal having a variable phase delay with respect to an input signal supplied through the input thereof based on the voltage of a control signal supplied from the control input thereof, the second voltage controlled delay circuit providing a phase delay substantially equal to the phase delay of the third voltage controlled delay circuit; a first signal transmission circuit including an input connected to the output of the first voltage controlled delay circuit and an output for supplying an output clock signal; a second signal transmission circuit including an input connected to the output of the first signal transmission circuit, the second signal transmission circuit having a propagation delay substantially equal to the propagation delay of the first signal transmission circuit; a first phase lock loop having a first input connected to the output of the third voltage controlled delay circuit, second input connected to the output of the second signal transmission circuit, and an output connected to the control inputs of the second and third voltage controlled delay circuits; and a second phase lock loop having a first input connected to the input of the first voltage controlled delay circuit, a second input connected to the output of the second voltage controlled delay circuit and an output connected to the control input of the first voltage controlled delay circuit, each of the first and second phase lock loop generating an output signal based on the phase difference between the signals supplied from the first and second inputs thereof.

According to a second aspect of the present invention, there is provided a clock signal distribution circuit which comprises a first voltage controlled delay circuit including an input for receiving an input clock signal; a second voltage controlled delay circuit including an input connected to the output of the first voltage controlled delay circuit; a third voltage controlled delay circuit including an input connected to the final output of the second voltage controlled delay circuit, each of the first through third voltage controlled delay circuits including a control input and generating an output signal having a variable phase delay with respect to an input signal supplied through the input thereof based on the voltage of a control signal supplied from the control input thereof, each of the second and third voltage controlled delay circuits including a plurality of cascaded variable delay gates, each of the variable delay gates including a control input connected to the control input of a corresponding one of the second and third voltage controlled delay circuit and generating an output signal having a variable phase delay with respect to an input signal supplied through the input thereof based on the voltage of a control signal supplied from the control input thereof; at least one first matched pair of serially connected transmission lines, having propagation delays substantially equal to each other, as described for the first aspect, above, having the first input connected to the output of the first voltage controlled delay circuit, an output for supplying an output clock signal at the node between the first transmission line and the second, and a final return output connected to one input of a first phase lock loop; at least one first signal transmission circuit including an input connected to the output of one of the variable delay gates of the second voltage controlled delay circuit and an output node for supplying an input clock signal; at least one second signal transmission circuit, disposed correspondingly to the first signal transmission line, including an input connected to the output of the first signal transmission circuit and an output connected to the input of a corresponding one of the variable delay gates of the third voltage controlled delay circuit, the second signal transmission circuit providing a propagation delay substantially equal to the propagation delay of the first signal transmission circuit; a first phase lock loop including a first input connected to the output of the third voltage controlled delay circuit, second input connected to the output of the first matched pair of signal transmission circuits, and an output connected to the control inputs of the second and third voltage controlled delay circuits; and a second phase lock loop including a first input connected to the input of said first voltage controlled delay circuit, a second input connected to the output of the second voltage controlled delay circuit and an output connected to the control input of the first voltage controlled delay circuit, each of the first and second phase lock loop generating an output signal based on the phase difference between the signals supplied from the first and second inputs thereof.

According to a third aspect of the present invention, there is provided a clock signal distribution circuit which comprises a voltage controlled delay circuit including an input for receiving an input clock signal and a control input, said first voltage controlled delay circuit generating an output signal having a variable phase delay with respect to an input signal supplied through the input thereof based on the voltage of a control signal supplied from a control input thereof; a first signal transmission circuit including an input connected to the output of said first voltage controlled delay circuit and an output for supplying an output clock signal; a second signal transmission circuit including an input connected to the output of said first voltage controlled delay circuit and having a propagation delay substantially equal to the propagation delay of said first signal transmission circuit; and a phase lock loop including a first input connected to the input of said voltage controlled delay circuit, second input connected to the output of said second signal transmission circuit, and an output connected to the control input of said voltage controlled delay circuit, the phase lock loop generating an output signal based on the phase difference between the signals supplied from the first and second inputs thereof.

The above and other objects as well as features and advantages of the present invention will be apparent from the following description of the preferred embodiments of the present invention as illustrated in the accompanying drawings.

DESCRIPTION OF THE PREFERRED EMBODIMENTS

Now, the present invention will be described in more detail with reference to the preferred embodiments thereof.

Figure 1:
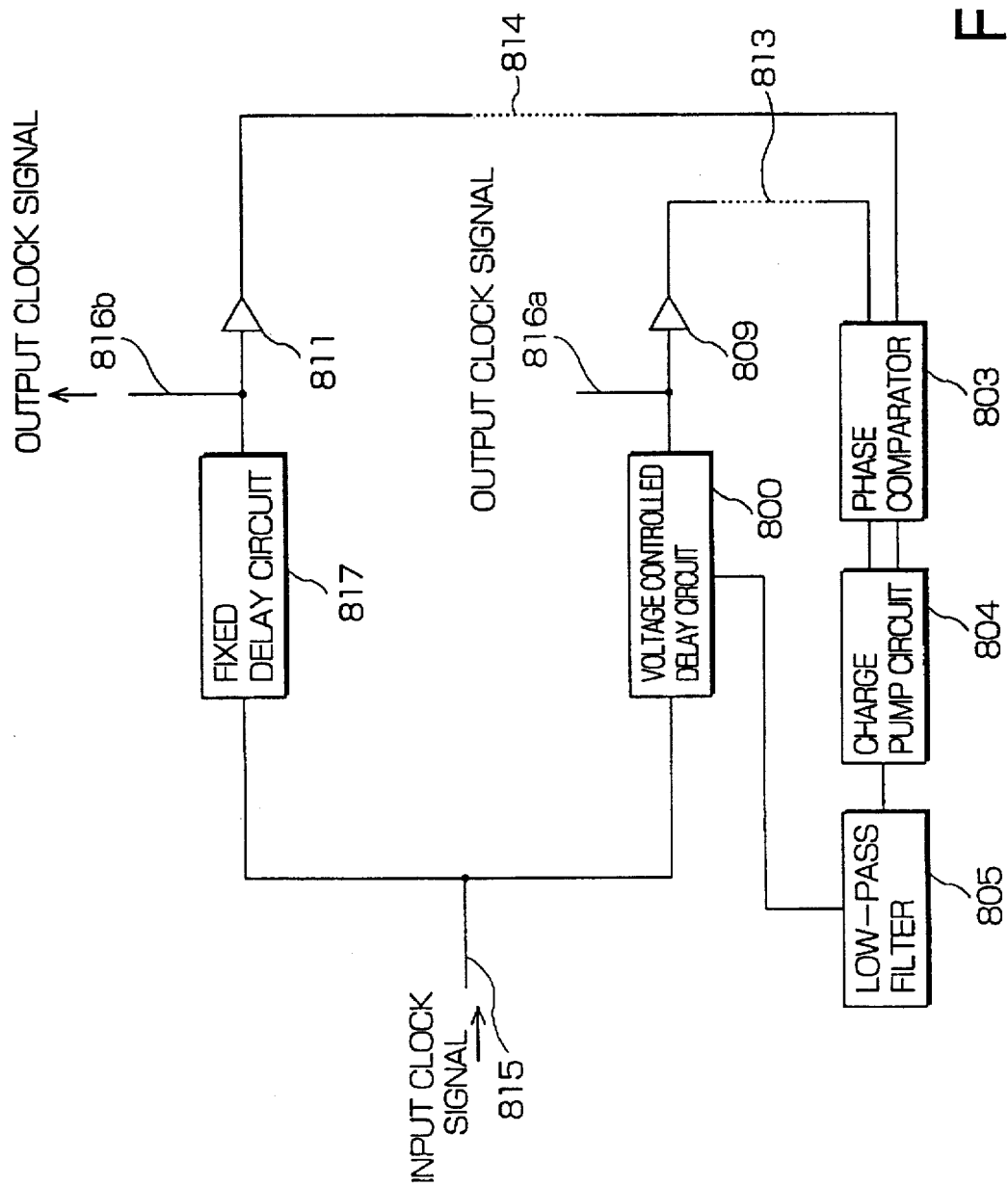
FIG. 1 is a block diagram of a conventional clock signal distribution circuit.
Figure 2:
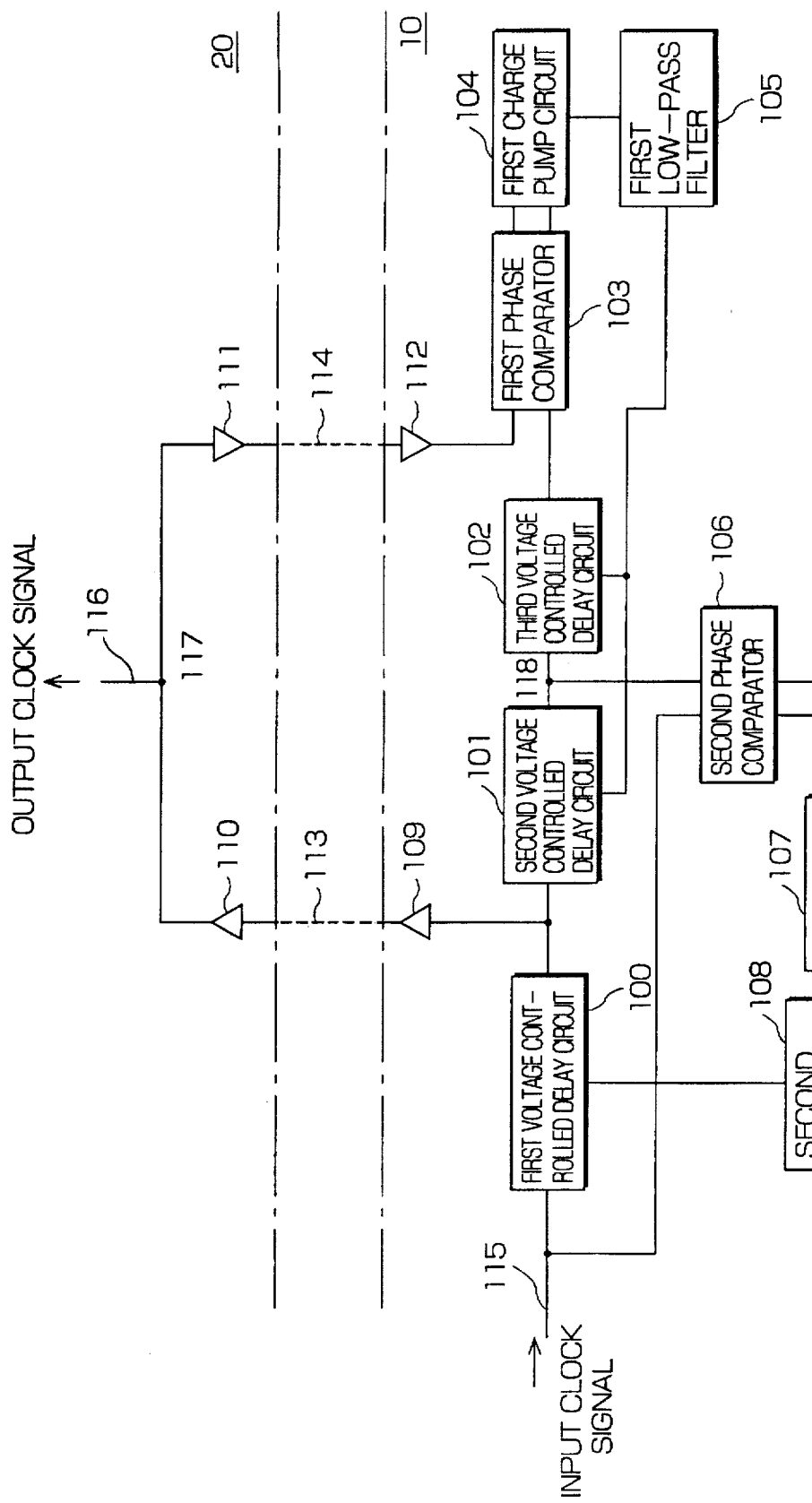
FIG. 2 is a block diagram of a clock signal distribution circuit according to a first embodiment of the present invention.

Referring to FIG. 2, a clock signal distribution circuit according to a first embodiment of the present invention is formed on and between two semiconductor chips 10 and 20 implementing an integrated circuit. The clock signal distribution circuit includes, on the first chip 10, a first through third voltage controlled delay circuits 100, 101 and 102, a first and a second phase comparators 103 and 106, a first and a second charge pump circuits 104 and 107, a first and a second low-pass filters 105 and 108, a first output buffer 109 and a first input buffer 112. The clock signal distribution circuit further includes a second input buffer 110 and a second output buffer 111 on the second chip 20, and a first and a second clock signal transmission lines 113 and 114 formed between the first chip 10 and the second chip 20 and having similar length to each other.

The first voltage controlled delay circuit 100 has an input connected to a clock generator (not shown) through an input clock signal line 115, and provides a delay or phase difference between the input clock signal and the output of the first voltage controlled delay circuit 100, the phase difference being controlled by a control signal supplied through a control input thereof. The second voltage controlled delay circuit 101 has an input connected to the output of the first voltage controlled delay circuit 100 and an output connected to the input of the third voltage controlled delay circuit 102. The first phase comparator 103, first charge pump circuit 104 and first low-pass filter 105 constitute a first phase lock loop, while the second phase comparator 106, second charge pump circuit 107 and second low-pass filter 108 constitute a second phase lock loop.

In detail, the first phase comparator 103 compares the clock signals supplied through the first and the second inputs thereof to provide the first charge pump circuit 104 with a pair of phase difference signals one of which has a pulse width proportional to the phase difference between the first input and the second input of the first phase comparator 103. The output of the first charge pump circuit 104 is provided through the first low-pass filter 105 to the control inputs of the second and third voltage controlled delay circuits 101 and 102 to control the variable delay times of the same.

The second phase comparator 106 receives the input clock signal from the input clock signal line 115 through the first input thereof and the output of the second voltage controlled delay circuit 101 through the second input of the second phase comparator 106, and compares the phases of both the input signals to provide an output phase difference signal, similarly to the first phase comparator 103, to the second charge pump circuit 107. The output of the second charge pump circuit 107 is supplied to the control input of the first voltage controlled delay circuit 100 through the second low-pass filter 108 to control the delay time of the first voltage controlled delay circuit 100.

The output from the first voltage controlled delay circuit 100 is also transmitted through the first output buffer 109 and the first clock signal transmission line 113 to the second chip 20. The input buffer 110 of the second chip 20 provides the clock signal to the internal circuit of the chip 20 through the output clock signal line 116. The 20 clock signal is also returned to the chip 10 through the output buffer 111 of the chip 20, the second signal transmission line 114 and the input buffer 112 of the chip 10. The returned output clock signal is supplied to the first input of the first phase comparator 103, the second input of which is connected to the output of the third voltage controlled delay circuit 102.

The length and characteristics, i.e., parasitic resistance and capacitance of the first clock signal transmission line 113 disposed between the first chip 10 and second chip 20 are designed to be equal to those of the second clock signal transmission line 114 disposed between the first chip 10 and the second chip 20 to equalize the propagation delays thereof. Similarly, the characteristics of the output buffers 109 and 111 are designed to coincide with each other to equalize the device delays thereof, while the characteristics of the input buffers 110 and 112 are designed to coincide with each other. By those configurations, the propagation delay generated between the output of the first voltage controlled delay circuit 100 and the output clock signal line 116 is substantially equal to the propagation delay generated between the output clock signal line 116 and the first input of the first phase comparator 103. The characteristics of the second and third voltage controlled delay circuits 101 and 102 are also designed to coincide with each other.

In operation, the input clock signal supplied through the input clock signal line 115 of the chip 10 is transmitted through the output clock signal line 116 by the clock signal distribution circuit as the output clock signal to the internal circuit of the chip 20, the phases of both the input and the output clock signals being equal to each other to thereby operate the internal circuits of the chips 10 and 20 by the common clock signal substantially without a clock skew.

In detail, the first phase lock loop functions for equalizing the phases of the first and second inputs of the first phase comparator 103. Accordingly, the phase delay provided by both the second and third voltage controlled delay circuit 101 and 102 becomes equal to the propagation delay provided by the branch including the buffers 109 through 112 and clock signal transmission lines 113 and 114. By this operation, the phase of the output clock signal on the node 117 connected to the output clock line 116 becomes equal to the phase of the output node 118 of the second voltage controlled delay circuit 101, because both the phases trail the phase of the output of the first voltage controlled delay circuit 100 by ½ of the phase difference between the first or second output of the first phase comparator 103 and the output of the first voltage controlled delay circuit 100.

The second phase lock loop functions for controlling first voltage controlled delay circuit 100 to equalize the phases of the first and second inputs of the second phase comparator 106. Accordingly, the phase of the output node 118 of the second voltage controlled delay circuit 101 becomes equal to the phase of the input clock signal. Therefore, the phase of the output clock signal supplied from the node 117 through the output clock signal line 116 becomes equal to the phase of the input clock signal supplied through the input clock signal line 115 by the function of both the first and second phase clock loops in a quiescent state.

In the clock signal distribution circuit of the present embodiment, it is easy to obtain, by employing the optimum layout etc., the configuration that the characteristics of the first and second clock signal transmission lines 113 and 114 are close to each other even in the case of a large length of the clock signal transmission lines 113 and 114 and that the characteristics of the second and third voltage controlled delay circuits are close to each other, with a practical accuracy.

By using the clock signal distribution circuit according to the present embodiment, a semiconductor integrated circuit fabricated on the two chips can be operated by a common clock signal substantially without a clock skew. The clock signal distribution circuit, however, may be formed on a single chip, or more than two chips by cascading two or more of the clock signal distribution circuit of FIG. 2.

Figure 3:
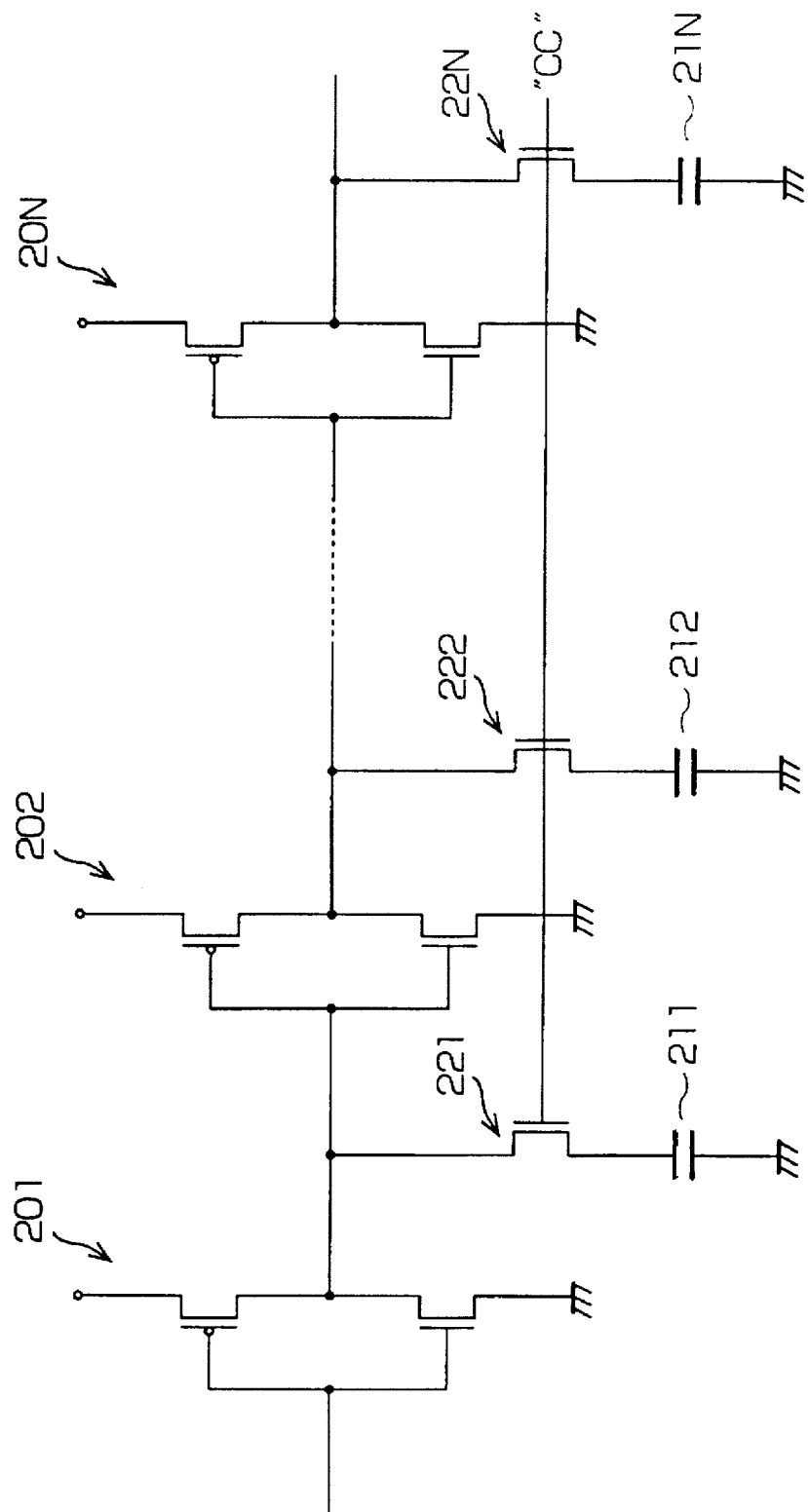
FIG. 3 is a circuit diagram of the voltage controlled delay circuit shown in FIG. 2.

FIGS. 3 through 6 show an example of the voltage controlled delay circuits 100, 101 and 102, the phase comparators 103 and 106, the charge pump circuits 104 and 107 and the low-pass filters 105 and 108, respectively, all of which are shown in FIG. 2.

in FIG. 3, the voltage controlled delay circuit has a plurality of cascaded CMOS inverters 201, 202, . . . , 20N and a variable load connected to each of the outputs of the plurality of CMOS inverters 201, 202, . . . , 20N. Each variable load has a capacitor 211, 212, . . . , 21N and a switching transistor 221, 222, . . . , 22N controlled by the control signal CC as supplied from outside the voltage controlled delay circuit. The magnitude of the variable load is determined based on the voltage level of the control signal CC so that the delay of each of the delay gates of the voltage controlled delay circuit is controlled based on the control signal CC.

Figure 4:
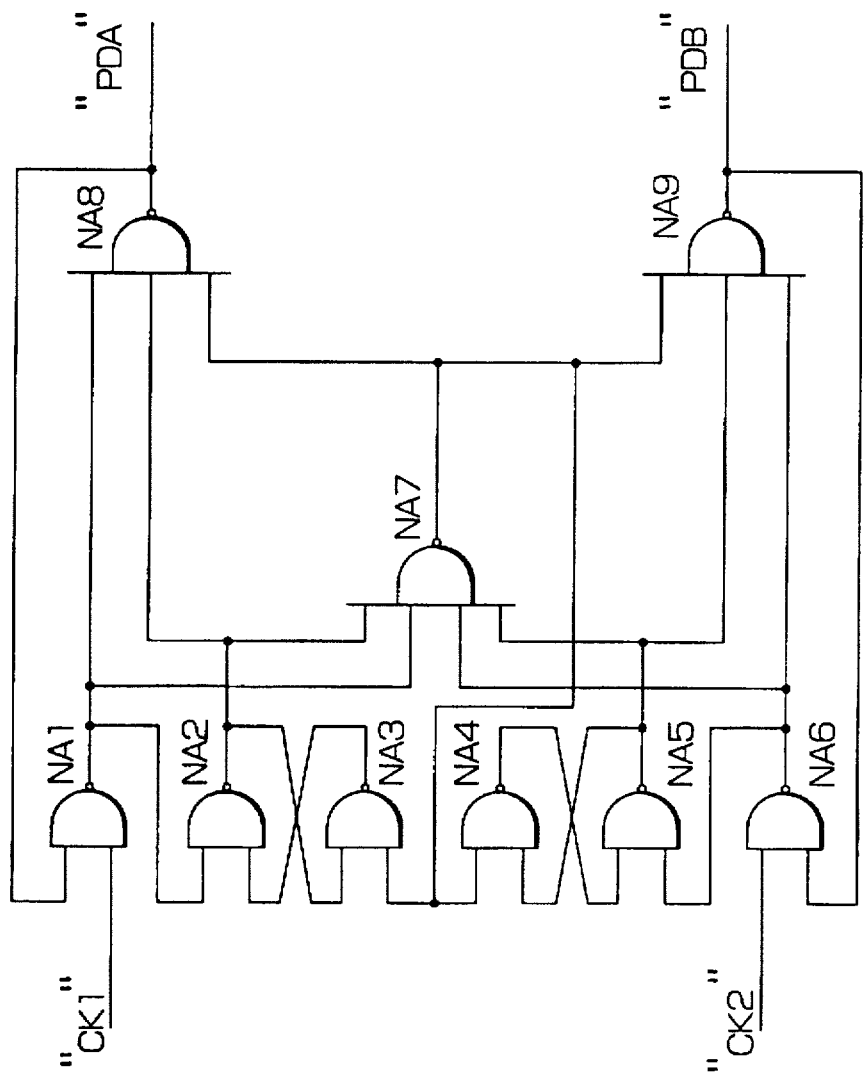
FIG. 4 is a circuit diagram of the phase comparator shown in FIG. 2.

In FIG. 4, the phase comparator is comprised of NAND gates NA1 to NA9, receives a first and a second input clock signals CK1 and CK2, and outputs a pair of phase difference signals PDA and PDB. The phase difference signals PDA and PDB are such that the pulse width of one of the phase difference signals PDA and PDB is determined by the phase difference between the first clock signal CK1 and the second clock signal CK2 while the other of the phase difference signals PDA and PDB remains at a high level.

Figure 5:
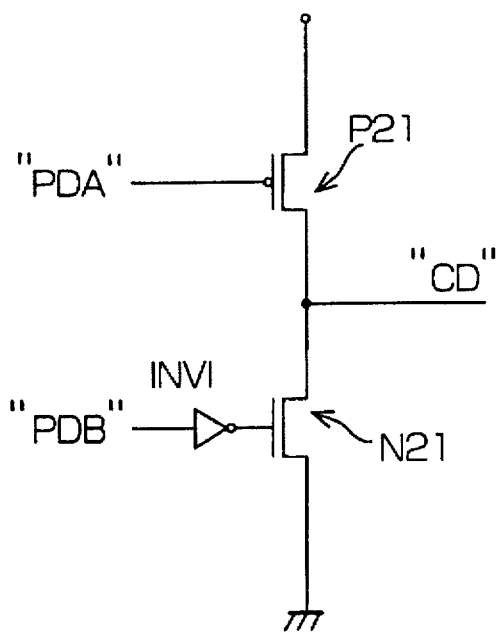
FIG. 5 is a circuit diagram of the charge pump circuit shown in FIG. 2.

In FIG. 5, the charge pump circuit is comprised of an inverter INV1 and a CMOS including a PMOS transistor P21 and an NMOS transistor N21, and generates an error signal CD exhibiting a voltage change proportional to the pulse width of one of the phase difference signals PDA and PDB. Namely, the output line of the charge pump circuit is charged from the power supply line through the PMOS transistor P21 during a low level of the phase difference signal PDA and discharged to the ground line through the NMOS transistor N21 during a low level of the phase difference signal PDB. The charge pump circuit converts the pair of phase difference signals PDA and PDB into an error signal CD having a voltage level based on the phase difference between the first clock signal CK1 and the second clock signal CK2.

Figure 6:
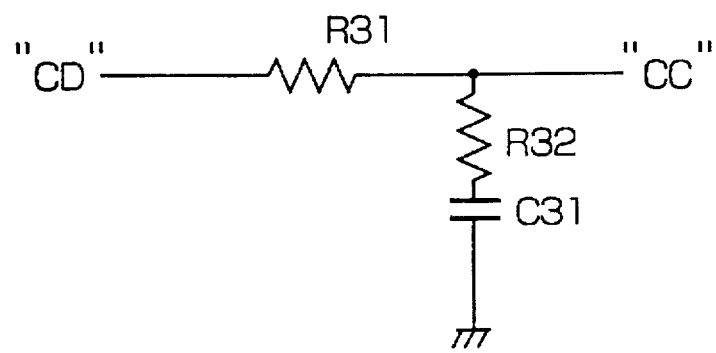
FIG. 6 is a circuit diagram of the low-pass filter shown in FIG. 2.

In FIG. 6, the low-pass filter is comprised of resisters R31 and R32 and a capacitor C31, and generates a control signal CC by smoothing the error signal CD output from the charge pump circuit. The control signal CD is supplied to a corresponding one of the voltage controlled delay circuits through the control input to control the delay time thereof based on the voltage level of the control signal CC.

The input and output buffers may be omitted from FIG. 2 especially in case of a clock signal distribution circuit formed on a single chip.

Figure 7:
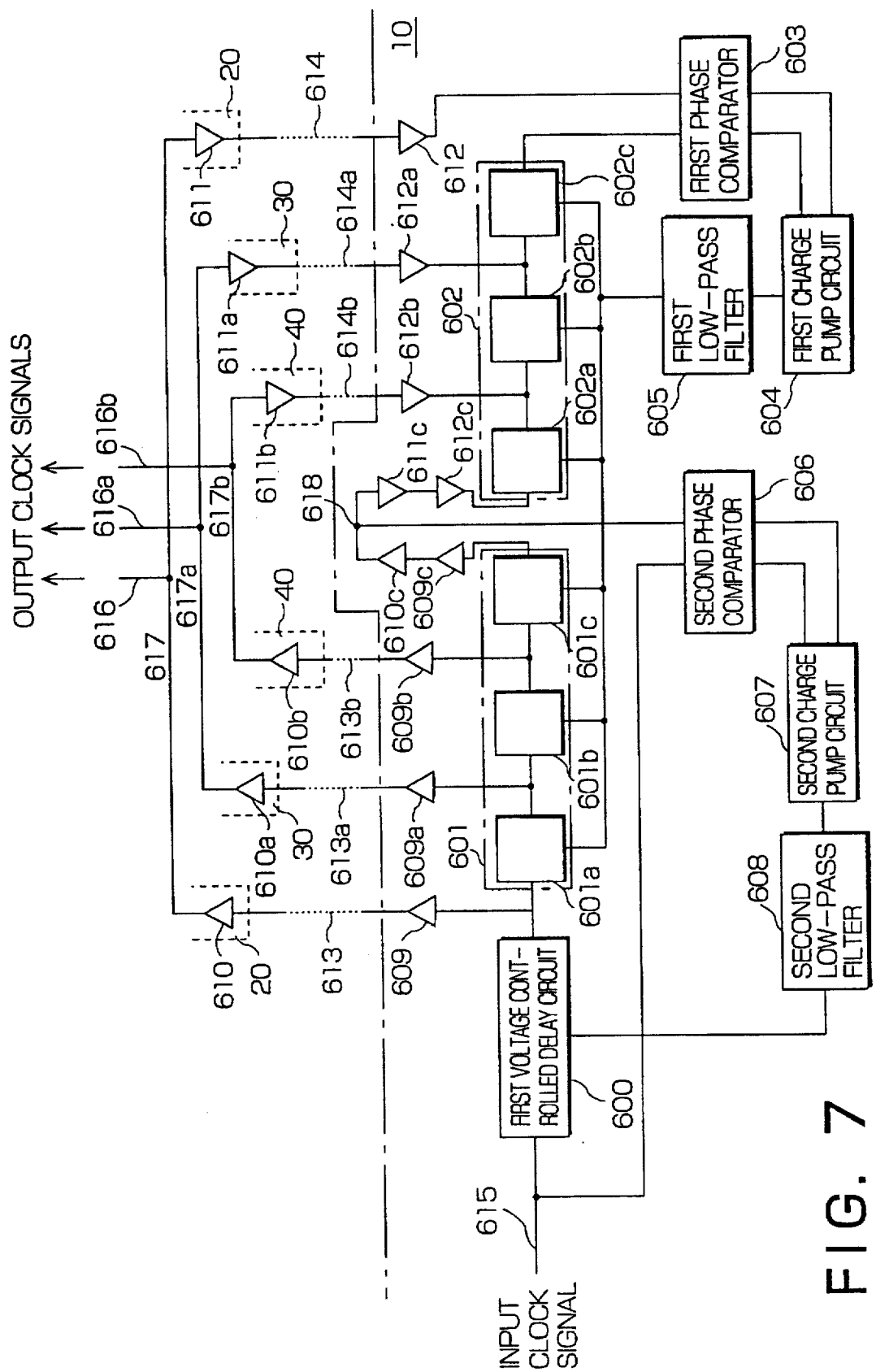
FIG. 7 is a block diagram of a clock signal distribution circuit according to a second embodiment of the present invention.

FIG. 7 shows a clock signal distribution circuit according to a second embodiment of the present invention. The clock signal distribution circuit is designed to provide the clock signal of a first chip 10 to a second through a fourth chips 20, 30 and 40. The clock signal distribution circuit includes a first voltage controlled delay circuit 600, a second voltage controlled delay circuit 601 including a plurality of (three in this embodiment) cascaded variable delay gates 601a, 601b and 601c, a third voltage controlled delay circuit 602 including a plurality of (three) cascaded variable delay gates 602a, 602b and 602c, a first and second phase comparators 603 and 606, a first and a second charge pump circuit 604 and 607, a first and a second low-pass filters 605 and 608, a plurality of branches each including output and input buffers, for example 609 and 610, for chip 20 and clock signal transmission lines, for example 613, between the chips, for example 10 and 20, and a plurality of cascaded buffers 609c, 610c, 611c and 612c. The plurality of cascaded buffers 609c, 610c, 611c and 612c are connected between the output of the last stage variable delay gate 601c of the second voltage controlled delay circuit 601 and the input of the first stage variable delay gate 602a of the third voltage controlled delay circuit 602 for cancelling the device delays of the output and input buffers included in the respective branches.

The first branch of the plurality of branches formed for the second chip 20 includes output buffer 609, first transmission line 613, input buffer 610, output buffer 611, second transmission line 614 and input buffer 612, and is connected between the input of the second voltage controlled delay circuit 601 and the first input of the first phase comparator 603. The second branch for the third chip 30 includes output buffer 609a, first transmission line 613a, input buffer 610a, output buffer 611a, second transmission line 614a and input buffer 612a, and is connected between the input of the second stage delay gate 601b of the second voltage controlled delay circuit 601 and the output of the second stage delay gate 602b of the third voltage controlled delay circuit 602. The third branch for the fourth chip 40 includes output buffer 609b, first transmission line 613b, input buffer 610b, output buffer 611b, second transmission line 614b and input buffer 612b, and is connected between the input of the third stage delay gate 601c of the second voltage controlled delay circuit 601 and the output of the first stage delay gate 602a of the third voltage controlled delay circuit 602. Each of the first through third branches is connected to an output clock line 616, 616a or 616b of the second through fourth chips 20, 30 and 40 for providing the output clock signal thereto at the center node 617, 617a and 617b of each of the branches. Each of the variable delay gates may be implemented by a delay gate or a plurality of delay gates such as shown in FIG. 3.

The first phase comparator 603, first charge pump circuit 604 and first low-pass filter 605 constitute a first phase lock loop for controlling the second and third voltage controlled delay circuits 601 and 602 to equalize the phases of the input signals supplied to the first and second inputs of the first phase comparator 603. On the other hand, the second phase comparator 606, second charge pump circuit 607 and second low-pass filter 608 constitute a second phase lock loop for controlling the first voltage controlled delay circuit 600 to equalize the phases of the first and second inputs of the second phase comparator 606. The length of each of the transmission lines between the chips is determined such that the ratio among lengths of the transmission lines 613, 613a, 613b, 614, 614a and 614b is 3:2:1:3:2:1. The delay "length" of each of the transmission lines is substantially equal to the delay length which is estimated from the output of the first voltage controlled delay circuit 600 to the corresponding output nodes 617, 617a and 617b or equivalently from the corresponding output nodes to the first input of the first phase comparator 603.

In operation, the first phase lock loop functions, similarly to the case of the first embodiment, for controlling the second voltage controlled delay circuit 601 and third voltage controlled delay circuit 602 to equalize the phase of the clock signal on each of the nodes 617, 617a and 617b and the phase of the signal on the node 618 connecting the output of buffer 610c with the input of buffer 611c, the node 618 being the second input of the second phase comparator 606. On the other hand, the second phase lock loop functions for controlling the first voltage controlled delay circuit 600 to equalize the phase of the input clock signal and the phase of the node 618 connecting the output of the buffer 610c with the input of buffer 611c. Therefore, the phase of the clock signal on each of the output clock signal lines 616, 616a and 616b becomes equal to the phase of the input clock signal supplied through the input clock signal line 615.

Each of buffers 609c, 610c, 611c and 612c compensates the device delay of corresponding one of the output buffers and input buffers of the chips. Accordingly, the ratio (3:2:1:3:2:1) provided for the transmission lines exactly corresponds to the ratio determined by the number of the voltage delay gates of the voltage controlled delay circuits excluded from the corresponding branch, so that the bypassed delay gates provide only a phase delay for the second input of the first phase comparator.

Alternatively, all of the output buffers, input buffers, compensating buffers may be omitted from the circuit of FIG. 7. For example, the output of variable delay gate 601c may be coupled directly to the input of variable delay gate 602a, and node 618.

The number of the variable delay gates may be arbitrarily determined in the second and third voltage controlled delay circuits, provided that the number of variable delay gates of both the second and third will voltage controlled delay circuits are equal to each other so that the number of the variable delay gates corresponds to the ratio among the lengths of the branches or provided that a phase delay ratio corresponding to the ratio among the transmission lines can be obtained in each of the delay circuits.

Figure 8:
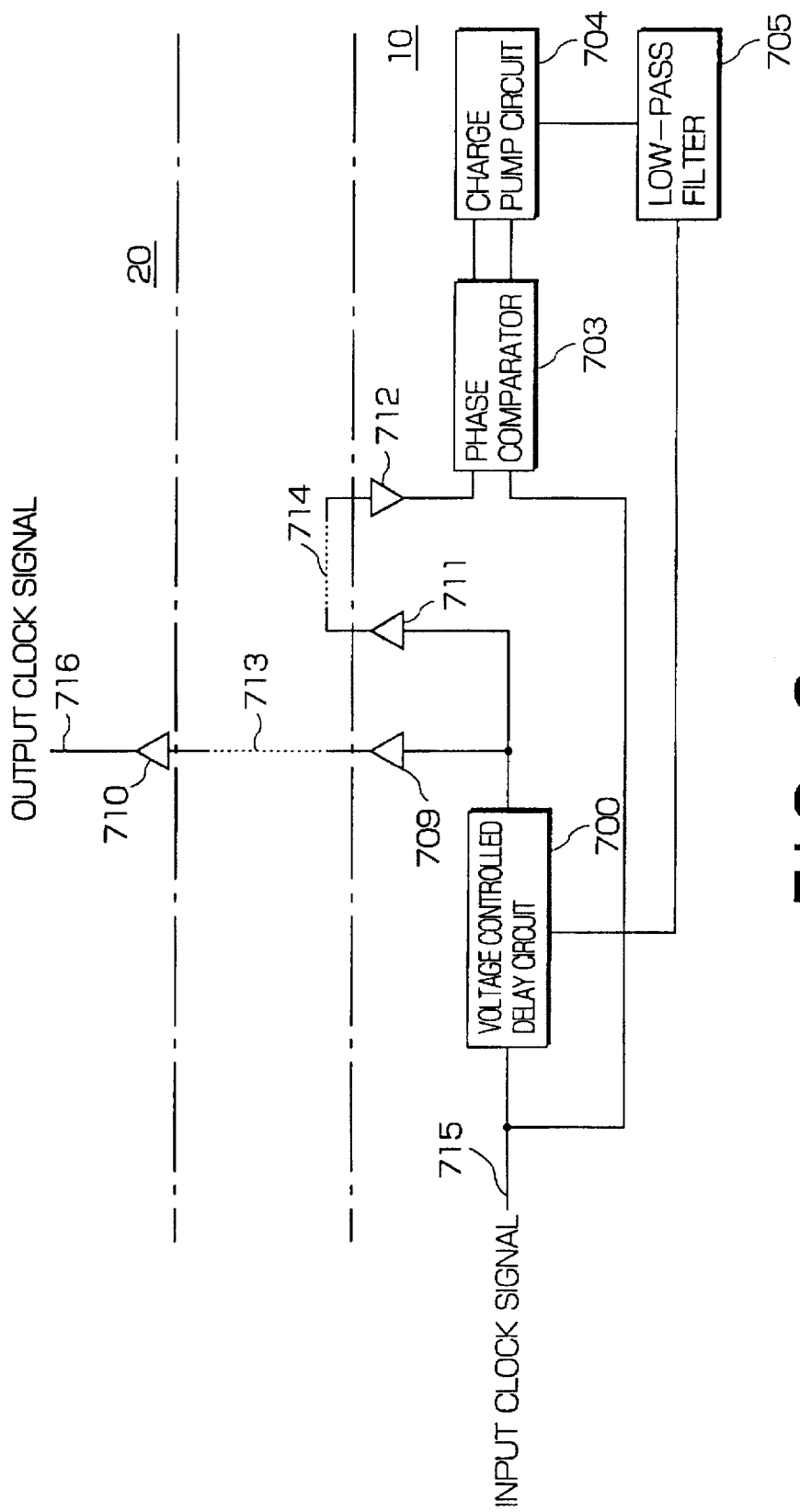
FIG. 8 is a block diagram of a clock signal distribution circuit according to a third embodiment of the present invention.

FIG. 8 shows a clock signal distribution circuit according to a third embodiment of the present invention. The clock signal distribution circuit includes, on a first chip 10, a voltage controlled delay circuit 700, a phase comparator 703 having a first input connected to the input clock signal line 715, a charge pump circuit 704, a low-pass filter 705, a first and a second output buffers 709 and 711 each having an input connected the voltage controlled delay circuit 700, and an input buffer 712 having an output connected to a second input of the phase comparator 703. The clock signal distribution circuit further includes an input buffer 710 on a second chip 20, transmission lines between the first chip 10 and the second chip 20, and a dummy transmission line 714 connecting the output of the second output buffer 711 with the input of the second input buffer 712 of the chip 10. The length of the dummy transmission line 714 is designed to be equal to the length of the transmission line 713 formed between the chips 10 and 20.

The phase comparator 703, charge pump circuit 704 and low-pass filter 705 constitute a phase lock loop for controlling the voltage controlled delay circuit 700 to equalize the phases of the first input of the phase comparator 703 connected to the input clock signal line 715 and the second input of the phase comparator 703. With this configuration, the input clock signal supplied through the input lock signal line 715 can be transmitted by the clock signal distribution circuit from the output signal line 716 on the second chip 20.

In operation, the phase lock loop functions for controlling the voltage controlled delay circuit 700 to equalize the phase of the second input of the phase comparator 703 and the phase of the input clock signal. Thus, the phase of the output clock signal becomes equal to that of the second input of the phase comparator 703 because the propagation delay provided by a first branch including first output buffer 709, transmission line 713 input buffer 710 is equal to the propagation delay provided by a second branch including the second input buffer 711, dummy transmission line 714 and input buffer 712. Therefore, the phase of the output clock signal becomes synchronized with that of the input clock signal In the embodiments as described above, the phase of the output clock signal is substantially equal to the input clock signal in spite of a large length of the clock signal transmission lines or a device delay generated by the output buffers or input buffers. Accordingly, the clock signal distribution circuits of the present invention can provide a clock signal to a semiconductor integrated circuit operating at a higher speed substantially without a clock skew. The clock signal distribution circuit of the present invention can be applied to a plurality of chips implementing an integrated circuit as well as a single chip implementing an integrated circuit.

Since the above embodiments are described only examples, the present invention is not limited to such embodiments and it will be obvious for those skilled in the art that various modifications or alterations can be easily made based on the above embodiments within the scope of the present invention.

What is claimed is:

1. A clock signal distribution circuit comprising:
   a first voltage controlled delay circuit including an input for receiving an input clock signal;
   a second voltage controlled delay circuit including an input connected to an output of said first voltage controlled delay circuit;
   a third voltage controlled delay circuit including an input connected to an output of said second voltage controlled delay circuit, each of said first through third voltage controlled delay circuits including a control input and generating an output signal having a variable phase delay with respect to an input signal supplied through the input thereof based on a voltage of a control signal supplied from the control input thereof, said second voltage controlled delay circuit generating a phase delay substantially equal to a phase delay of said third voltage controlled delay circuit;
   a first signal transmission circuit including an input connected to an output of said first voltage controlled delay circuit and an output for supplying an output clock signal;
   a second signal transmission circuit including an input connected to the output of said first signal transmission circuit, said second signal transmission circuit having a propagation delay substantially equal to a propagation delay of said first signal transmission circuit;
   a first phase lock loop including a first input connected to an output of said third voltage controlled delay circuit, a second input connected to an output of said second signal transmission circuit, and an output connected to the control inputs of said second and third voltage controlled delay circuits; and
   a second phase lock loop having a first input connected to the input of said first voltage controlled delay circuit, a second input connected to the output of said second voltage controlled delay circuit and an output connected to the control input of said first voltage controlled delay circuit, each of said first and second phase lock loop generating an output signal based on a phase difference between the signals supplied from the first and second inputs thereof.

2. A clock signal distribution circuit as defined in claim 1 wherein said clock signal distribution circuit is formed on two chips implementing an integrated circuit.

3. A clock signal distribution circuit as defined in claim 2 wherein each of said first and second signal transmission circuits includes a signal transmission line disposed between the two chips.

4. A clock signal distribution circuit as defined in claim 3 wherein each of said first; and second signal transmission circuits further includes at least one of an output buffer and an input buffer connected to said signal transmission line.

5. A clock signal distribution circuit comprising:
   a first voltage controlled delay circuit including an input for receiving an input clock signal;
   a second voltage controlled delay circuit including an input connected to an output of said first voltage controlled delay circuit;
   a third voltage controlled delay circuit including an input, connected to an output of said second voltage controlled delay circuit, each of said first through third voltage controlled delay circuits including a control input, an output, and generating an output signal having a variable phase delay with respect to an input signal supplied through the input thereof based on the voltage of a control signal supplied from the control input thereof, each of said second and third voltage controlled delay circuits including a plurality of cascaded variable delay gates, including at least a first variable delay gate starting a cascade and a final variable delay gate ending the cascade, each of said variable delay gates including a control input connected to the control input of a corresponding one of said second and third voltage controlled delay circuits and generating at an output an output signal having a variable phase delay with respect to an input signal supplied through an input thereof based on the voltage of a control signal supplied from the control input thereof;

at least two pairs of signal transmission circuits including at least one first signal transmission circuit including an input connected to the input of said first variable delay gate of said second voltage controlled delay circuit and an output node for supplying a first output clock signal;

at least one second signal transmission circuit, disposed correspondingly to said first signal transmission circuit, including an input connected to the output node of said first signal transmission circuit and an output connected to a first input of a first phase lock loop;

at least one third signal transmission circuit including an input, connected to an output of one of said variable delay gates of said second variable controlled delay circuit, and an output node for supplying a second output clock signal;

at least one fourth signal transmission circuit disposed correspondingly to said third signal transmission circuit, including an input connected to the output node of said third signal transmission circuit and an output connected to the input of a corresponding one of said variable delay gates of said third voltage controlled delay circuit, said second signal transmission circuit providing a propagation delay substantially equal to the propagation delay of said first signal transmission circuit;

wherein said first phase lock loop includes a second input connected to an output of said third voltage controlled delay circuit and an output connected to the control inputs of said second and third voltage controlled delay circuits; and a second phase lock loop including a first input connected to the input of said first voltage controlled delay circuit, a second input connected to the output of the final variable delay gate of said second voltage controlled delay circuit and an output connected to the control input of said first voltage controlled delay circuit, each of said first and second phase lock loop generating an output signal based on the phase difference between the signals supplied from the first and second inputs thereof.

6. A clock signal distribution circuit as defined in claim 5 wherein the input of said third voltage controlled delay circuit is connected to the output of the final variable delay gate of said second voltage controlled delay circuit through at least one buffer, wherein at least one of said first and second signal transmission circuits includes a number of said buffers equivalent to the number of said at least one buffer.

7. A clock signal distribution circuit as defined in claim 5 wherein said clock signal distribution circuit is formed on a plurality of chips implementing an integrated circuit.

8. A clock signal distribution circuit as defined in claim 7 wherein each of said signal transmission circuits includes a signal transmission line disposed between two of said chips.

9. A clock signal distribution circuit as defined in claim 8 wherein each of signal transmission circuits further includes at least one of an output buffer and an input buffer connected to said signal transmission line.

10. A clock signal distribution circuit comprising:

a voltage controlled delay circuit including a clock input for receiving an input clock signal, and a control input, said voltage controlled delay circuit generating an output signal having a variable phase delay with respect to the input clock signal based on the voltage of a control signal supplied to the control input thereof;

a first signal transmission circuit including an input connected to an output of said voltage controlled delay circuit and an output for supplying an output clock signal, wherein said output clock signal lags said input clock signal by a certain propagation delay;

a second signal transmission circuit including an input connected to the output of said voltage controlled delay circuit and having an output signal with a propagation delay substantially equal to the certain propagation delay of said first signal transmission circuit; and a phase lock loop including a first input directly connected to the clock input of said voltage controlled delay circuit, second input connected to the output of said second signal transmission circuit, and an output connected to the control input of said voltage controlled delay circuit, said phase lock loop generating an output signal based on the phase difference between the signals supplied at the first and second inputs thereof.

11. A clock signal distribution circuit as defined in claim 10 wherein said clock signal distribution circuit is formed on two chips implementing integrated circuit.

12. A clock signal distribution circuit as defined in claim 11 wherein each of said first and second signal transmission circuits includes a signal transmission line disposed between the two chips.

13. A clock signal distribution circuit as defined claim 12 wherein each of said first and second signal transmission circuits further includes at least one each of an output buffer and an input buffer connected to said signal transmission line.

14. A clock signal distribution circuit comprising:

a plurality of variable delay circuits each having an input, a control input and an output, said output providing an output signal having a variable phase delay with respect to a clock signal supplied to the input thereof, based on a control signal supplied to the control input thereof;

a first series and a second series, each said series including at least one of said variable delay circuits, wherein the input of a first of said at least one variable delay circuits is a first input of said series;

a first voltage controlled variable delay circuit has a source clock signal connected to the input and its output connected to the first input of said first series;

the output of each variable delay circuit included in either one of said series is coupled to the input of a next variable delay circuit included in said series and the output of the last variable delay circuit in each series provides a final output, the final output of the second series is connected to a first input of a first phase lock circuit, and the final output of the first series is connected to a first input of the second series, and to a first input of a second phase lock circuit;

a plurality of matched pairs of signal transmission circuits, each pair having an outgoing circuit and a matched returning circuit having a propagation delay substantially equal to each other, each said outgoing and matched returning circuit having an input and an output, the output of the outgoing circuit being an output clock node connected to the input of the matched returning circuit;

wherein a first matched pair of said signal transmission circuits has the input of the outgoing circuit connected to the output of said first voltage controlled variable delay circuit and the output of the matched returning circuit connected to a second input of said first phase lock circuit;

wherein the remaining pairs of matched transmission circuits each has the input of the outgoing circuit connected to the output of a variable delay circuit in the first series, and the output of the matched returning circuit connected to the input of a corresponding variable delay circuit in the second series, such that the number of variable delay circuits in the first series coming before the outgoing circuit corresponds to the number coming after the matched returning circuit in the second series;

wherein said first phase lock circuit has an output connected to the control inputs of all variable delay circuits in the first and second series, and said second phase lock circuit has an output connected to the control input of the first variable delay circuit; and wherein said first and second phase lock circuits each generate an output signal which is proportional to the difference in phase between the signals at the first and second inputs thereof.

15. A clock signal distribution circuit as defined in claim 14 wherein said first input of said second series is connected to the final output of said first series through at least one buffer; and at least one of said plurality of matched pairs of signal transmission circuits includes an equivalent number of said at least one buffer.

16. A clock distribution circuit as defined in claim 14 wherein said clock signal distribution circuit is formed on a plurality of chips implementing an integrated circuit.

17. A clock signal distribution circuit as defined in claim 16 wherein each of said outgoing circuit and matched returning circuit of at least one matched pair of signal transmission circuits includes a signal transmission line disposed between two of said chips.

18. A clock signal distribution circuit as defined in claim 17 wherein each of said outgoing circuits and matched returning circuits of at least one matched pair of signal transmission circuits further includes at least one each of an output buffer and an input buffer connected in series with said signal transmission line.

* * * * *

UNITED STATES PATENT AND TRADEMARK OFFICE
CERTIFICATE OF CORRECTION

PATENT NO.   : 5,670,903
DATED        : September 23, 1997
INVENTOR(S)  : Masayuki MIZUNO It is certified that error(s) appears in the above-identified patent and that said Letters Patent is hereby corrected as shown below:

Column 13, line 19, after "first" insert --voltage controlled--.

Signed and Sealed this

Twenty-fourth Day of February, 1998

Attest:

BRUCE LEHMAN

*Attesting Officer*   *Commissioner of Patents and Trademarks*